(12) United States Patent
Lee

(10) Patent No.: US 6,367,056 B1
(45) Date of Patent: *Apr. 2, 2002

(54) METHOD FOR INCREMENTAL TIMING ANALYSIS

(75) Inventor: Fung Fung Lee, Milpitas, CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/228,873

(22) Filed: Jan. 11, 1999

(Under 37 CFR 1.47)

Related U.S. Application Data

(60) Provisional application No. 60/082,993, filed on Apr. 23, 1998.

(51) Int. Cl.[7] .............................. G06F 9/45
(52) U.S. Cl. ........................................ 716/5
(58) Field of Search .............. 716/4, 5, 6, 7, 716/8, 2, 18

(56) References Cited

U.S. PATENT DOCUMENTS

| | | | |
|---|---|---|---|
| 4,882,690 A | 11/1989 | Shinsha et al. ............ 364/490 |
| 5,111,413 A | 5/1992 | Lazansky et al. .......... 364/578 |
| 5,301,318 A | 4/1994 | Mittal ....................... 395/600 |
| 5,335,320 A | 8/1994 | Iwata et al. ................ 395/155 |
| 5,341,308 A | 8/1994 | Mendel ...................... 364/489 |
| 5,436,849 A | 7/1995 | Drumm ...................... 364/490 |
| 5,442,790 A | 8/1995 | Nosenchuck ............... 395/700 |
| 5,473,547 A | 12/1995 | Muroga ...................... 364/489 |
| 5,526,517 A | 6/1996 | Jones et al. ................ 395/600 |
| 5,541,849 A | 7/1996 | Rostoker et al. .......... 364/489 |
| 5,636,133 A | 6/1997 | Chesebro et al. .......... 364/491 |
| 5,712,794 A | 1/1998 | Hong ......................... 364/491 |
| 5,721,912 A | 2/1998 | Stepczyk et al. ........... 395/633 |
| 5,724,251 A | 3/1998 | Heavlin ..................... 364/491 |
| 5,754,441 A | 5/1998 | Tokunoh et al. ............ 364/488 |
| 5,761,079 A | 6/1998 | Drumm ...................... 364/489 |
| 5,812,847 A | 9/1998 | Joshi et al. ................ 395/682 |
| 5,825,661 A | 10/1998 | Drumm ...................... 364/491 |
| 5,831,863 A | 11/1998 | Scepanovic et al. ........ 364/488 |

(List continued on next page.)

OTHER PUBLICATIONS

Robert B. Hitchcock, Sr. et al., "Timing Analysis of Computer Hardware", vol. 26, No. 1, pp. 100–105, Jan. 1982.

Limaiem and Ammar, "A Computer Assisted Process Planning System Based on Optimization Criteria Compromises," *IEEE International Symposium on Assembly and Task Planning*, pp. 101–108, 1995.

Mace and Diamond, "Use of Programmable Logic Devices as an Aid to System Design," *IEEE Colloquium on Programmable Logic Devices for Digital Systems Implementation*, pp. 1/1–1/5, 1990.

Ginetti and Brasen "Modifying the netlist after Placement for Performance Improvement," 1999 IEEE Custom Integrated Circuits Conference, pp. 9.2.1 through 9.2.4, 1993.

*Primary Examiner*—Matthew Smith
*Assistant Examiner*—Calvin Lee
(74) *Attorney, Agent, or Firm*—Beyer Weaver & Thomas LLP

(57) ABSTRACT

An "incremental" timing analysis or simulation uses much of the results of a previous timing simulation. The previous timing results were obtained for a previous electronic design which was slightly modified by the designer. The portion of the design affected by the modification is identified and its timing is recalculated. The timing for the remainder of the design is left as is from the previous design. The boundaries of the region affected by the design modification may be determined by various methods. If the timing analysis is performed at an early stage in the overall design process, the method chosen may be relatively simple; i.e., it need not account for load, parasitic capacitance, etc.

37 Claims, 9 Drawing Sheets

U.S. PATENT DOCUMENTS

| | | | |
|---|---|---|---|
| 5,856,926 A | 1/1999 | Matsumoto et al. | 364/490 |
| 5,859,776 A | 1/1999 | Sato et al. | 364/468.28 |
| 5,867,396 A | 2/1999 | Parlour | 364/489 |
| 5,867,399 A | 2/1999 | Rostoker et al. | 364/489 |
| 5,870,308 A | 2/1999 | Dangelo et al. | 364/489 |
| 5,875,112 A * | 2/1999 | Lee | 364/489 |
| 5,896,521 A | 4/1999 | Shackleford et al. | 395/500 |
| 5,903,475 A | 5/1999 | Gupte et al. | 364/578 |
| 6,102,964 A * | 8/2000 | Tse et al. | 716/18 |

* cited by examiner

METHOD FOR INCREMENTAL TIMING ANALYSIS

CROSS REFERENCE TO RELATED APPLICATION

This application claims priority of provisional U.S. Patent Application Ser. No. 60/082,993, filed Apr. 23, 1998, entitled "METHODS FOR INCREMENTAL TIMING ANALYSIS FOR TIMING-DRIVEN PLACEMENT AND ROUTING" which is incorporated herein by reference for all purposes.

BACKGROUND OF THE INVENTION

This invention relates to timing analyses for determining whether timing requirements are met in electronic designs. More specifically, the invention relates to rapid techniques for performing such timing analyses by recalculating a timing parameter for only a portion of the electronic design.

Electronic design automation ("EDA") is becoming increasingly complicated and time consuming, due in part to the greatly increasing size and complexity of the electronic devices designed by EDA tools. Such devices include general purpose microprocessors as well as custom logic devices including Application Specific Integrated Circuits ("ASICs"). Examples of ASICs include non-programmable gate arrays, Field Programmable Gate Arrays ("FPGAs"), and Complex Programmable Logic Devices ("PLDs" or "CPLDs"). The design of even the simplest of these devices typically involves generation of a high level design, logic simulation, generation of a network, timing simulation, etc.

Timing analyses or simulations are performed to determine whether a particular design meets timing requirements specified by the designer. Such requirements may be necessary to ensure compliance with the requirements of an application for which the device will be used. Usually, timing simulation cannot be performed until the design has been compiled to the point where various gate level entities (representing at least a subsection of the overall design) are synthesized and placed and the lines therebetween are routed on a target hardware device. This compilation requires that an initial design (or a significant piece of it) be functionally completed.

Quite typically, a designer (or the compiler itself) will modify a design, after an initial compilation. This may be required when a timing simulation or other design analysis conducted after (or as part of) compilation indicates a problem. Or, the product requirements may change in the middle of the device's development. Regardless of why a design change is necessary, that change requires a recompile. With some or all such recompiles, the designer conducts timing analyses.

In a hierarchical or "top down" design process, initial designs may specify generic logic blocks (e.g., an arithmetic logic unit) without specifying the gate level logic. Other parts of the design may be completed to the gate level. Such initial designs are very coarse; i.e., they are far removed from the final exact hardware layout of the whole device. Results of timing simulations performed after compilation at these early stage designs will necessarily lack precision. The design parameters are not completely defined at the silicon level and the design will likely change/evolve as development progresses. Nevertheless, a timing analysis can be performed on these initial designs in order to determine whether the timing parameters are within the general range ("ballpark") specified by the designer. In later stage designs, the timing parameters can be gauged with more precision and accuracy.

If a design is being driven primarily by timing considerations so that the goal is a very fast device, obviously the timing simulations must be performed very frequently during the design process. In this case, a designer may conduct timing simulations with each small design modification. If the design is driven primarily by some other parameter such as logic density, then timing simulations may not be necessary quite as often. But regardless of whether the design is driven more by timing constraints or area constraints, some form of timing analysis must be frequently performed during the design process.

To guide later stages of design and to verify that timing requirements are met, timing analyses are typically performed before, during, and after "fitting." Fitting is a process whereby a compiler fits an electronic design onto a target hardware device. For PLD designs, fitting can be divided into three phases: partitioning, placement, and routing. Partitioning involves grouping logic cells which share common inputs/outputs and/or feed one another. This grouping is intended to minimize the amount of long distance routing. Cells that frequently communicate with each other or share common resources should be placed close together so that most routing is local. During the placement phase, the various logic groups or blocks created during partitioning are assigned to specific geographic locations on a hardware device. Finally, routing makes interconnections between the various logic blocks that are now placed on the hardware device. Normally, the timing of each new "fit" of a design is checked.

While the primary goal of timing analyses is to ensure that the resulting electronic design and constituent circuits are meet timing requirements (i.e., they are fast), it is also important to ensure that the timing analyses themselves can be executed rapidly. Each compilation and associated timing simulation consumes significant time, so multiple recompiles/timing simulations translates to significantly longer development times. This can greatly slow the time to market for an integrated circuit under design. Because PLDs rely on a short time to market as a major selling point, slow development can erase any commercial advantage.

The problem is compounded because maximum CPLD device sizes are increasing at a speed slightly greater than that predicted by Moore's law (i.e., each new chip contains roughly twice as much capacity as its predecessor, and each chip is released within 18–24 months of the previous chip). If compilation time was a linear function of design size then it would be expected that the time to compile the largest device on the most powerful computer would remain approximately constant. Unfortunately, compile times are typically proportional to $n^2$, where n is the number of logic elements on a device. This means that a design twice as big takes four times as long to compile (on a given computer). Consequently, the compile times for the largest devices are accelerating. It is not uncommon for large projects to compile for about 24 hours or more on a modern workstation. Obviously, the fastest compilers (and associated timing simulators) will become critical components of integrated circuit design environments.

It appears that most available design products do not perform timing analysis as rapidly as they might. Therefore, there is a need for more rapid techniques for performing timing analyses in large and/or complex electronic designs.

SUMMARY OF THE INVENTION

The present invention provides an "incremental" timing analysis or simulation in which much of the results of a previous timing simulation are used. The previous timing results were obtained for a previous electronic design which was slightly modified by the designer. The portion of the design affected by the modification is identified and its timing is recalculated. The timing for the remainder of the design is left as is from the previous design. This speeds the timing analysis for the modified design because less than the entire design need be considered in the new timing analysis.

In this invention, the timing analyses of interest are performed after considering at least one and usually two "regions" associated with a design change: (1) the region of the design change itself and (2) a possibly larger region having its timing influenced by the design change.

The process of interest is triggered when a "first electronic design" is converted to a "second electronic design." This involves taking the first design and modifying a portion of it by refitting that area, changing the logic in that area, or otherwise changing that area. In an important embodiment, it involves refitting the portion. As a result of the modification, some portion of the first design will be modified. That portion is referred to herein as a "modified portion." The remainder of the design is referred to as the "unmodified portion." Thus, the second electronic design includes a modified portion and an unmodified portion. The modified portion may have had the gates themselves changed, cell fan-in or fan-out changed, the location of a cell changed, etc. In an important embodiment, the modification involves only a change in location of a logic cell. The fan-in and fan-out of the moved cell (as well as the other cells) remain unmodified.

The modification will typically have an affect on timing results. The design system of this invention will store timing results of a "first timing analysis" performed on the first electronic design. The modification to the first electronic design will typically impact the timing results. The trick here is to determine the timing results of the second electronic design without redoing the entire timing simulation for the second electronic design. To accomplish this, the invention delineates an "affected portion" of the second electronic design where the timing results are likely to have been locally changed as a result of the modification. Often the "affected portion" will subsume the "modified portion." Once this affected portion has been identified, the timing simulation of the second electronic design can be streamlined. It involves first calculating a "local timing result" for the affected portion of the design, and second calculating an "overall timing result" for the second electronic design by using the local timing result and an "unmodified timing result." This unmodified timing result is the portion of the timing result from the first electronic design that corresponds to that location of the first electronic design that lies outside of the "affected portion."

Preferably, the first electronic design is a design of a partially completed ASIC design, such as a PLD design. Often the timing analysis will be performed on a compiled version of the design. Thus, the first timing analysis will be performed on a compiled version of the first electronic design. The analysis results are then stored. Subsequently, the base design is modified to form the second electronic design, which is then recompiled and analyzed per the second timing analysis.

Preferably, the modification to the first electronic design is a refitting of the logic associated with that design. In a particularly preferred embodiment, the refitting involves moving cells such as by repartitioning cells between two logic groups. Each new design (the second electronic design, etc.) may be generated by moving a single cell from one logic block to another, as is performed in conventional partitioning processes. Each cell movement affects the timing by changing the lengths of lines connecting to the moved cell. It also affects the loads on those cells.

In coarse timing analyses (such as those performed relatively early in the overall design process), the timing analysis of the second electronic design may be conducted without regard to the load changes on the lines to and from a moved cell. In one embodiment, such "load-independent" analysis requires that the "affected portion" of the second electronic design be the fan-out from the output nodes of a cell that has been moved, together with the moved cell itself. For more precise timing analyses (often performed relatively late in the overall design process), the timing analysis of the second electronic design considers the load changes on the lines to and from a moved cell. In one embodiment, such "load-dependent" analysis requires that the "affected portion" of the second electronic design be the fan-out from the output nodes of all cells that feed the cell that has been moved.

The goal of many timing analyses is to determine whether the overall timing result meets a given timing constraint. Thus, the present invention also provides for comparing the overall timing result (obtained for the second electronic design) with a design constrain. Sometimes the design constraint is not posed in the same timing type or criteria as the type used in the timing analysis. For example, the timing constraint may be specified as Tcycle whereas the timing analysis is conducted with Tpd. When this is the case, it may be convenient to have a preliminary step of converting the timing constraint from a first type to a second type.

This invention also pertains to devices (e.g., PLDs) designed using the timing analyses described herein. Further, the invention covers machine readable media or computer program products having instructions and/or data for implementing the timing analyses described herein.

In another aspect, this invention provides a system for an electronic design automation (EDA) system that includes at least a fitter (which fits logic onto a target hardware device such as a PLD) and a timing analyzer. The timing analyzer in turn includes (i) a "delineator" which identifies an affected region of a modified design where timing may have been locally changed as a result of a modification from a previous design, and (ii) a "timer" which calculates the timing at nodes within the affected region. The system may also include a database communicating with the fitter and storing design data for the modified design and the previous design.

The timing analyzer may obtain the data it needs in at least two ways. In a first embodiment, it obtains the design data from the database directly, without having the design data past through the fitter. In a second embodiment, it obtains the design data from the database indirectly, via the fitter.

In preferred embodiment, the fitter will be provided as part of an electronic design compiler. The compiler may contain other modules or entities such as a logic synthesizer. In a preferred embodiment, the logic fit by the fitter onto the target hardware device takes the form of logic cells. In this embodiment, the fitter may move one or more logic cells to create the "modified design."

These and other advantages of the present invention will become apparent to those skilled in the art upon a reading of the following descriptions of the invention and a study of the several figures of the drawing.

DETAILED DESCRIPTION OF THE PREFERRED EMBODIMENTS

1. Introduction

Figure 1:
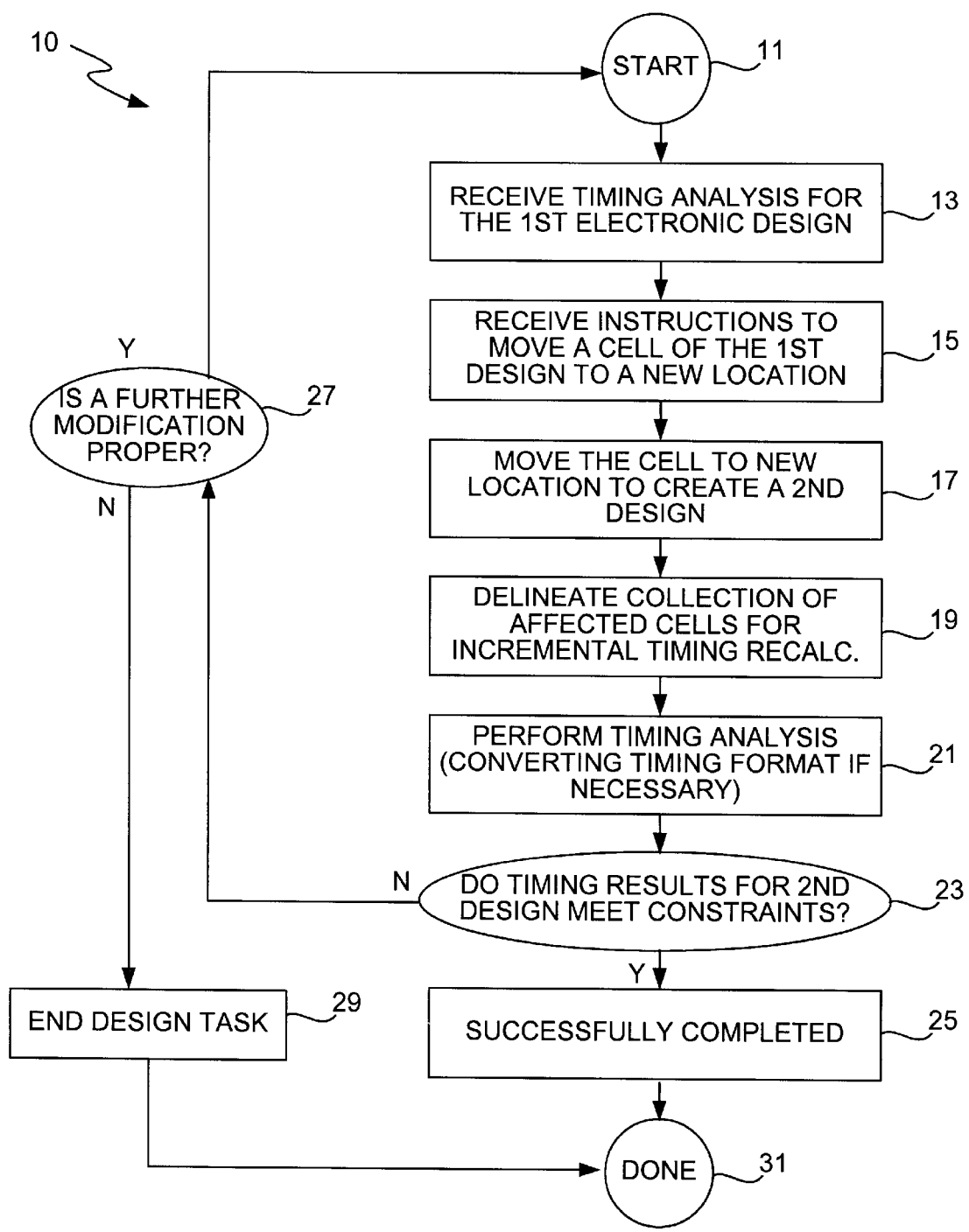
FIG. 1 is a process flow chart illustrating the invention at a high level in context of a larger design effort.

This invention relates to incremental timing analyses. Some of terms used herein to illustrate the principles of this invention are not universally used in the art. Other terms may have multiple meanings in the art. Therefore, the following definitions are provided as an aid to understanding the description that follows. The invention as set forth in the claims should not necessarily be limited by these definitions.

The term "compiler" is used throughout this specification to refer to software—and apparatus for running such software—that compiles an electronic design. It may also refer to specially designed hardware which implements some or all of the compiler functions. Compiler functions may include synthesizing a netlist, fitting a synthesized netlist on a target hardware device, simulating an electronic design, etc. In the context of this invention, a compiler will preferably contain a timing analyzer or provide results that are amenable to analysis by a timing analyzer.

The term "electronic design" refers to the logical structure of an electronic device such as an integrated circuit. It may be implemented on hardware (usually referred to herein generically as a "target hardware device"). During the design and development effort, an electronic design (often a digital circuit design) may exist in various states or stages. It may be provided as a high level Boolean representation (encoded in a hardware design language for example), as a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

When in the form of a synthesized netlist, an electronic design may be divided into "logic cells" representing various logic functions within the electronic design. These logic cells are mapped onto "logic elements" of the target hardware device during compilation. The criteria for mapping gates into logic cells is that a resulting logic cell must be able to be put into one logic element. An example of a logic cell is a collections of gates (connected in some way and implemented in a look-up table) combined with a register and configured to implement a multiplexer.

The term "target hardware device" refers to a hardware device on which an electronic design is implemented. Examples include circuit boards and systems including multiple electronic devices and multi-chip modules, as well as integrated circuits. Specific examples of integrated circuits include traditional integrated circuits with full custom layouts, hardwired ASICs (e.g., gate arrays) designed with high level design tools, and programmable ASICs such as FPGAs and PLDs. In the case of non-programmable integrated circuits such as gate arrays, the electronic design defines the arrangement of metal lines on one or more metallization layers of the target hardware device. In the case of programmable integrated circuits such as PLDs, the electronic design defines the gate functions as well as interconnects to be programmed on the target hardware device.

In the context of this invention, a target hardware device typically includes a plurality of "logic elements" which house logic cells from an electronic design in order to implement the logic functions specified by these cells. The logic elements are typically a fundamental element of the hardware device's architecture on which different logic gates can be defined. Such elements may contain generic programmable look up tables, product term circuits, etc. In "hierarchical" embodiments, these elements may be locally grouped such that each logic element is associated with a block (or other arbitrary containment entity). There may be higher level organization in the device such that logic blocks are grouped into half-rows, rows, or some other arbitrary entity.

In the case of a FLEX10K CPLD (available from Altera Corporation of San Jose, Calif.), for example, logic elements are provided at the bottom level of a containment hierarchy. In this architecture, multiple logic elements are grouped into logic array blocks (LABs), which are in turn organized into half-rows, which are in turn organized into rows. By way of contrast, in the case of the XC4000 (available from Xilinx Corporation of San Jose, Calif.) logic elements are provided in a flat grid without a hierarchical structure.

Examples of logic elements include a product term macrocell employed in the MAX 9000 family of CPLDs available from Altera Corporation and a look up table ("LUT") employed in the FLEX 10K and FLEX 8000 families of CPLDs (Altera Corporation). These logic elements are described in the Altera 1998 Data Book, available from Altera Corporation of San Jose, Calif. The Data Book is incorporated herein by reference for all purposes. Another example of a logic element is the multiplexer-based element employed in some devices available from Actel Corporation of Sunnyvale, Calif. Those of skill in the art will recognize that many other logic elements are known and may be used with this invention.

2. Context of the Invention

This invention relates to incremental timing analyses. While most examples presented herein depict hierarchical PLD designs, the methodologies of this invention find application in any electronic design compilation in which timing simulations are employed.

Various types of design modifications affect timing analyses. The incremental timing analyses of this invention may be integrated in a design effort as follows. Initially, at least a portion of a first electronic design is at least defined to point where a timing simulation can be performed. Then a first timing simulation is performed in a suitable manner. In some cases, sufficient definition of the first electronic design involves compiling the design. The compilation of a design prior to timing analysis can involve any standard electronic design compilation process. In the case of a traditional integrated circuit design created using high level design tools, for example, compilation involves the following steps: (a) synthesis from a hardware design language (e.g., VHDL or Verilog) and (b) automatic place and route. Further details of these steps can be found in various sources and usually depend on the type of the electronic design being created. The following references further describe these steps as applied to a hierarchical PLD design: U.S. patent application Ser. No. 08/958,002 filed Oct. 27, 1997, titled GENERATION OF SUB-NETLISTS FOR USE IN INCREMENTAL COMPILATION, and naming as inventors Bruce Pedersen, Francis B. Heile, Marwan Adel Khalaf, and David Wolk Mendel; U.S. application Ser. No. 08/958,436 filed Oct. 27, 1997, titled FITTING FOR INCREMENTAL COMPILATION OF ELECTRONIC DESIGNS, and naming inventors John Tse, Fung Fung Lee, and David W. Mendel; and U.S. application Ser. No. 08/958,670 filed Oct. 27, 1997, titled PARALLEL PROCESSING FOR COMPUTER ASSISTED DESIGN OF ELECTRONIC DEVICES, and naming David W. Mendel. Each of these references is incorporated herein by reference in its entirety and for all purposes.

In keeping with the desire to speed the overall design process, the compilation process may be an "incremental compilation" process. Specific approaches to incremental compilation are described in the above-mentioned U.S. patent applications Ser. Nos. 08/958,002; 08/958,436; and 08/958,670. The incremental timing analyses of the present invention may, but need not, be applied with a design system employing incremental compilation. In essence, incremental compilation involves using a previously compiled design such that only a fraction of that design must be recompiled after a user or compiler makes one or more changes to the design. Incremental compilation requires at least two steps: (1) delineating a sphere of influence of user changes in a previously compiled design (the sphere of influence typically being defined within a netlist), and (2) recompiling the logic from within this sphere of influence into appropriate logic elements available within a target hardware device. To maximize efficiency, the compiler should limit recompile to a minimum region of the electronic design (and a corresponding region of a target hardware device) which is directly affected by the design change.

In the incremental timing simulations of this invention, the designer modifies the first electronic design (after it has been previously simulated). Such modification could apply at any stage during the overall electronic design process. It may apply at an initial stage when large sections of the total design remain as unfinished blocks, it may apply at a final stage when the positions of most cells are fixed, or it may apply at any stage in between. The precision and accuracy of a subsequent timing simulation will greatly depend upon where the modification occurs in this overall flow. In the early stages, the simulation will necessarily be coarse. In later stages, the simulation will necessarily be finer. The present invention may account for these differences by providing different types of incremental analysis for different stages in the overall design process.

Modifications can take many forms. They may involve changing the design circuitry (e.g., at the netlist level) or may involve a less significant change such as changing the placement of a cell. In a preferred implementation of this invention, it involves moving a single cell, as by changing the first electronic design's partitioning or placement of logic blocks. The algorithms that follow are specifically geared to incremental timing analysis resulting from a change in the design caused by a refitting the first electronic design. Such changes could come about by a change in partitioning, placement of cells, or routing between cells.

It is possible that multiple fitting changes may be made between the time when the first timing analysis is performed (on the first design) and when the second timing analysis is performed (on the second design). For example, numerous cells may be moved between the times when the first and second analyses are conducted. This situation can be handled in two ways. First, the incremental timing analysis could be performed in one step by simultaneously considering all the changes as a single change. Alternatively, the incremental timing analysis could separately consider each of the sub-steps that led to the larger change.

In the specific example that follows, the fitting change is movement of a single cell from one position to another. This keeps with the methodology used in many traditional place and route tools. It is assumed that all connections to the moved cell remain the same. That is, the fan-out and the fan-in remain the same. However, the lines making those connections change in length. FIG. 1 presents a flow chart illustrating the context and high level features of this example of the present invention.

As shown in FIG. 1, a process 10 begins at 11, and then at a process step 13 the design system receives a "first timing analysis" of the first electronic design. At a step 15, the system receives instructions from a designer to move a cell in the first electronic design. The instructions specify the new location of the cell (e.g., to a new logic element). The design system then moves the cell to the specified location to initiate creation of the second electronic design. See step 17.

At this point, the second electronic design contains a modified portion which deviates from the first electronic design and an unmodified portion with remains substantially unchanged from the first electronic design. For example, the moved cell and associated input and output lines constitute a modified portion. As mentioned such modifications affect the timing simulation in some way such that results of the first timing simulation are typically no longer completely valid. Nevertheless, some parts of the first timing analysis may remain unchanged (valid). The valid parts correspond to specific locations of the second electronic design (typically unmodified from the first electronic design). At these locations, the signal arrival times remain the same in the second electronic design (with respect to the first design). Such regions where timing results (typically arrival times) are unaffected by the modification are deemed "unaffected." Other regions where the timing results have changed are referred to as "affected."

At a step 19, the design system determines where the affected portion of the second electronic design lies. One preferred technique for accomplishing this is described below. Next at a step 21 the design system evaluates timing consequences of the modification by focusing on the affected portion. This is an "incremental timing analysis." If necessary, the system converts the timing analysis format or type of the design prior to evaluating.

After the incremental timing analysis has been completed at step 21, the system determines whether the timing results meet the timing constraints imposed on the design. See decision step 23. If the system determines that the second design meets the timing constraints (i.e., decision step 23 is answered in the affirmative), then the current design task is deemed successfully completed at a step 25 and the process concludes at 31. If on the other hand the system determines that the second design fails to meet the timing constraints (i.e., decision step 23 is answered in the negative), then the system determines whether a further design modification (to produce a third electronic design for example) is appropriate. This decision is made at a step 27 which in effect determines whether the current design task has gone through a maximum number of iterations without sufficient improvement. If so, the current design task is deemed to have failed at a step 29 (the process task finishes at 33) and a new tack is taken.

In the above process flow, a collection of affected cells must be identified first before the new timing analysis is performed. These affected cells represent a sub-set of the total cells or ports in the electronic design under consideration. Because the method limits the new timing analysis to the sub-set, it requires less computation resources to perform the timing analysis than the traditional process flow, which would require analysis of each and every cell and/or port in the electronic design.

Note that step 21 allows for a format conversion in the timing analysis. In a preferred embodiment, the timing analyzer is configured to perform only one type of timing analysis (e.g., a Tpd timing analysis). A conversion may be necessary when the designer specifies a timing constraint in one timing format (e.g., $T_{su}$) and the timing analyzer component of the design system performs timing analysis in another format (e.g., $T_{pd}$). In one example, a constraint expressed in terms of Tcycle is converted to a Tpd problem. Tcycle is the time required for a signal to propagate from one register's output port to another register's input port. Tpd is the time required for a signal to propagate from a primary input pin to a primary output pin of a combinational circuit. To transform a Tcycle constraint to a Tpd analysis, the register boundaries of the Tcycle are compared to the locations of the primary input and output pins. An appropriate coordinate transformation is then made (simply by adjusting the end point of the reference timing path). If a primary input pin is located downstream from the output port of the first register used to reference Tcycle, then the "Tcycle value" at the primary input pin will be greater than zero. A simple coordinate transformation is all that is required to convert the Tcycle values to Tpd values in this example. In a preferred embodiment, the timing analyzer uses Tpd to calculate timing delays. In general, there are five conventional types of timing requirement: Tpd and Tcycle as described above, Tco from a clock/register output port to a primary output pin, Tsu and Thold from a primary input pin to a register input port with respect to the clock of the register. The timing analysis of any of these types can be converted to a timing analysis of type Tpd. The Tpd requirements can be checked by simple addition and subtraction, once the arrival time at each pin (port) of the circuit is obtained.

3. Determining the Boundaries of a Region Affected by a Design Modification

Figure 2:
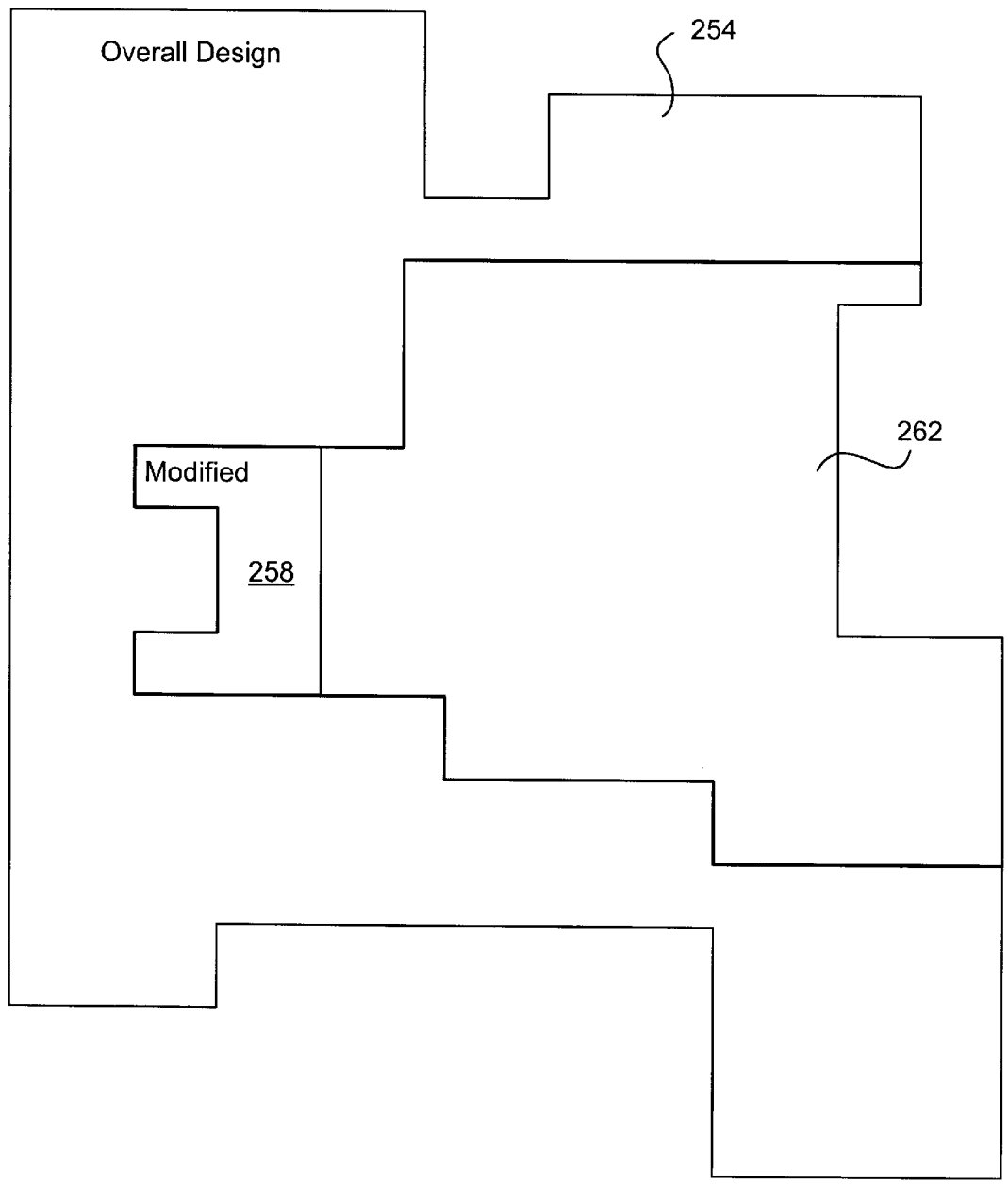
FIG. 2 is an idealized representation of an electronic design showing the boundaries of a modified region caused by a design modification and an affected region having its timing affected by the modification, with both the modified and affected regions shown within larger unmodified and unaffected regions of the overall design.

FIG. 2 presents a generic representation of an electronic design. A design 254 represents a complete second electronic design for a given device or a substantially independent portion of that design. It may or may not subsume an entire physical layout of logic elements in a target hardware device. Within overall design 254, there is a "modified region" 258 representing the portion of overall design 254 changed by a user's modification(s) to a first electronic design. For example, modified region 258 may represent one or more logic cells that have been moved from a first logic element (in the first electronic design) to a second logic element (in the second electronic design) on a target hardware device. While FIG. 2 shows only a single modified region 258, it should be understood that overall design 254 may contain multiple changed regions.

The changes actually made at the hands of the designer may have been limited to one or a few gates representing a subsection of changed region 258. However, those changes typically have a wider sphere of influence—directly affecting the timing of a more encompassing region than delineated by the boundaries of modified region 258. This wider timing affected area is shown generally as an affected region 262 depicted in thick lines and subsuming the modified region 258.

It is a function of this invention to identify the boundaries of affected region 262 within a second (modified) electronic design. Once those boundaries are found, the timing analyzer need only recalculate timing within those boundaries. The timing values in an unaffected region 264 representing the remainder of design 254 falling outside the boundaries of region 262 remain valid and may be kept from the timing analysis performed on the first electronic design (prior to modification). Together the recalculated timing values within affected region 262 and the previous timing values within unaffected region 264 are used to determine the overall timing of the second electronic design 254.

Obviously, affected region 262 should be made as small as possible to reduce the timing analyzer's work on incremental timing simulation. This allows the timing simulation to be performed much faster than if the entire design 254 had to be resimulated after the designer's modification. Generally, the magnitude of the design modification's affect on timing will decrease upstream (from a signal propagation stand point) from the modification and laterally from the modification. When highly accurate timing simulations are required, the region 262 should be drawn widely enough to cover even those regions that are minimally affected by the design modification.

Figure 3:
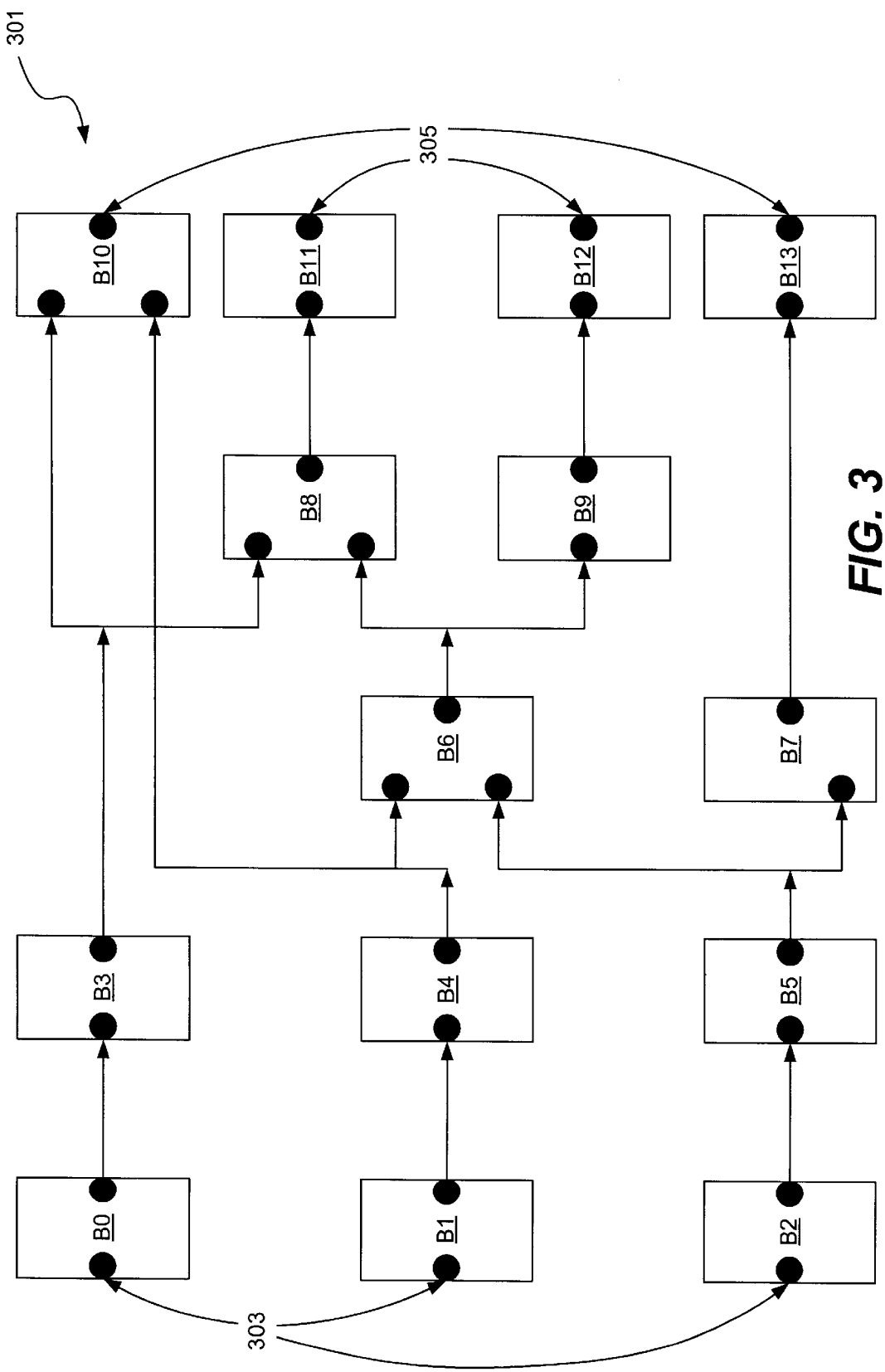
FIG. 3 is a schematic illustration of a small combinational circuit (first electronic design) including a plurality of logic cells fixed in logic elements, with each cell having multiple ports defining fan-ins and fan-outs.
Figure 4:
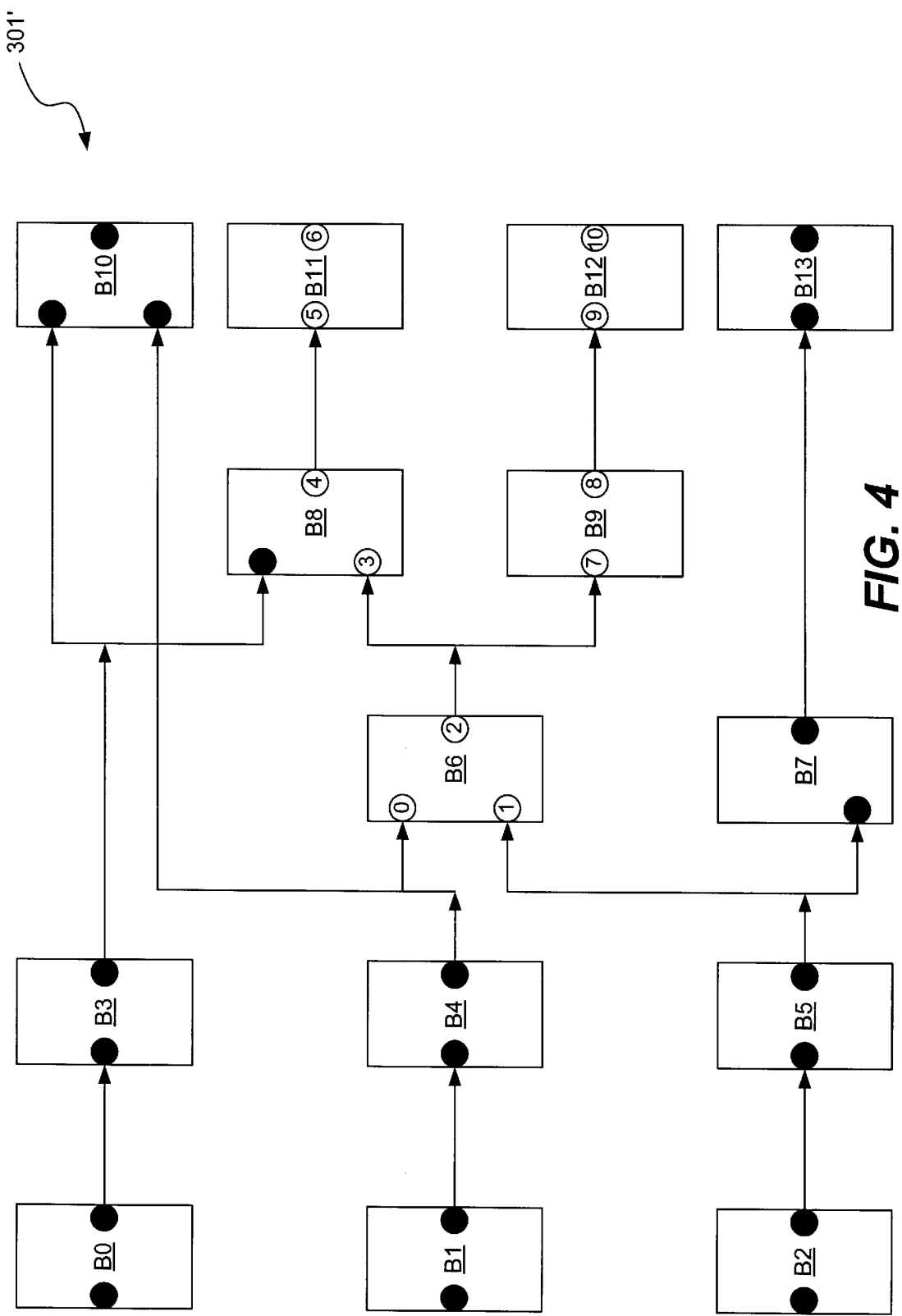
FIG. 4 is a schematic illustration of the combinational circuit shown in FIG. 3, but assuming that one cell has been moved to a different logic element to create a second electronic design and thereby affect the timing analysis of a number of cells in a load-independent manner.
Figure 5:
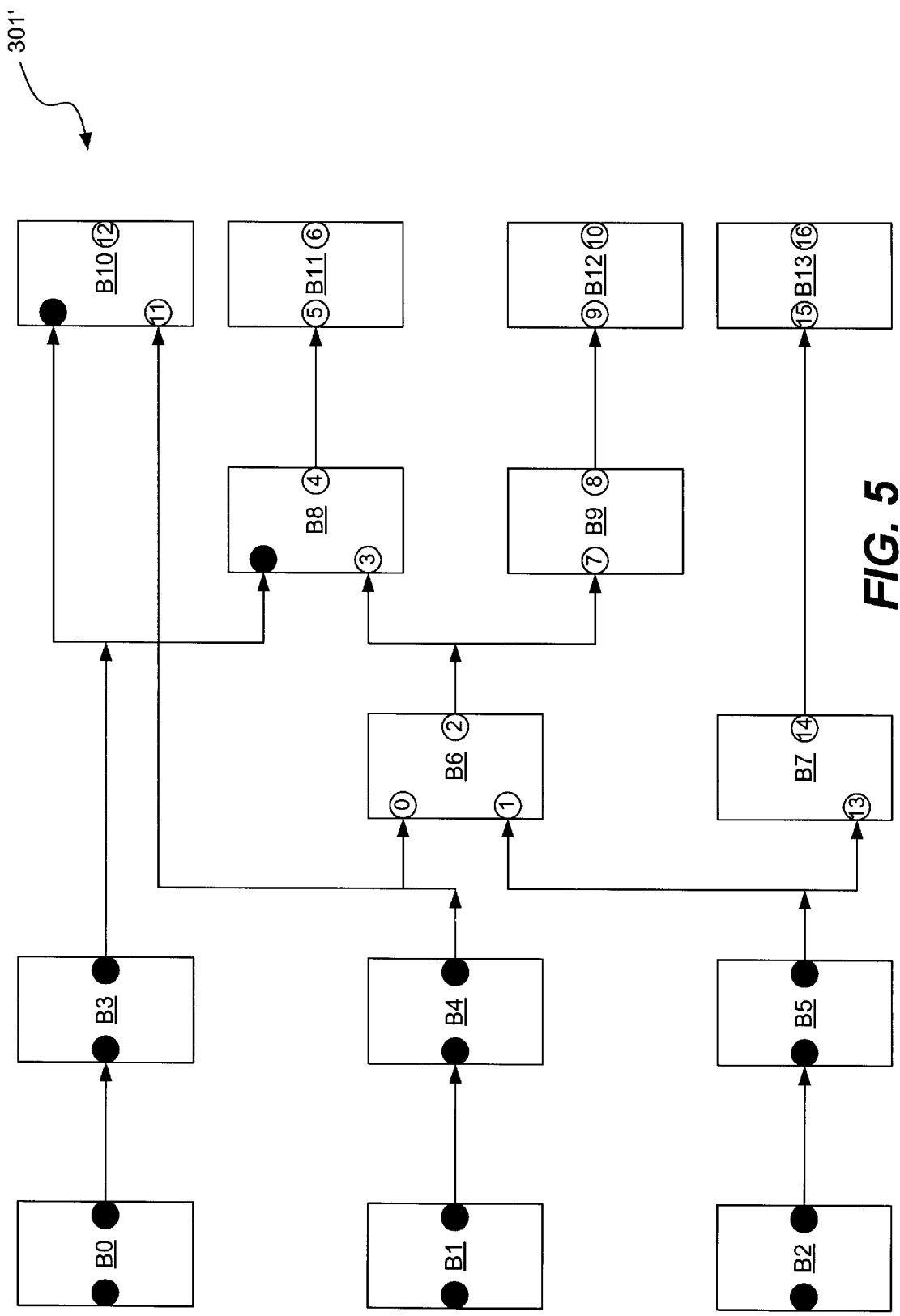
FIG. 5 is a schematic illustration of the combinational circuit shown in FIGS. 3 and 4, but assuming that one cell has been moved to a different logic element to create a second electronic design and thereby affect the timing analysis of a number of cells in a load-dependent manner.

Many techniques for delineating the boundaries of the affected region exist and can be envisioned. The present invention is not limited to any particular one or group of such techniques. Basic techniques might consider only the direct downstream affect of the change. More accurate techniques might consider secondary effects such as load redistribution, parasitic capacitance, etc. FIGS. 3–5 show examples of two suitable techniques, one deemed "load independent" (FIG. 4) and one deemed "load dependent" (FIG. 5).

FIG. 3 shows a simple combinational circuit layout 301 that might be encountered by a timing analyzer of this invention. Each block (labeled B0 through B13) represents a unique cell and each port of each cell is indicated by a solid dot. Primary input ports 303 are presented on the left side of the layout and primary output ports 305 are provided at the right side of the design. Thus, signals flow from the left side to the right side. While each cell could have substantially more complex fan-ins and fan-outs, for simplicity the cells in this figure are limited to only a single output and not more than two inputs. Note that this figure could possibly represent an entire electronic design—but a very simply electronic design at that. Alternatively, it might represent a section of a design that is under consideration. In this case, the depicted primary input and output pins do not necessarily represent input and output pins of the entire chip. They simply represent, in this case, the ports that are feeding or receiving signals from cells of other blocks the overall design.

Assume circuit 301 represents the first "unmodified" electronic design. Assume also that a complete timing analysis has been performed on it. FIG. 4 shows the circuit layout 301 after it has been modified by a designer to create a second electronic design 301' (possibly corresponding to layout 254 of FIG. 2). This modification involves no more than moving cell B6 from its first location to a second location on the target hardware device. The "modified region" of 301' is therefore B6 alone.

When a cell such as cell B6 is moved, it has various effects on timing. Assuming that the fan-in and fan-out of the cell have not changed (i.e., the connections into and out of cell B6 remain the same as shown), then the movement affects only the line lengths and the loads on those lines. Nevertheless, this modification changes the timing result.

FIG. 4 assumes that the affected region is independent of changes to the loads on the lines influenced by the movement of cell B6. Note that in FIG. 4 the ports of moved cell B6 as well as cells located downstream from that moved cell have changed from solid shading to open circles. The open circles indicate that the timing results at those ports are now invalid as a result of the move. These "invalid" ports must now have their timing results recalculated. Collectively they represent the "affected region" of design 301' (possibly corresponding to region 262 of FIG. 2). As noted, in conventional timing analyses, each and every port in the entire design would have to be recalculated as a result of the move. The incremental timing analysis of this invention is limited to the ports that are likely to be affected by the move. This considerably reduces the amount of computational resources that must be devoted to the timing analysis.

As shown in FIG. 4, input ports 0 and 1 as well as output port 2 of cell B6 have been marked invalid. Further, other ports located downstream from cell B6 have been marked invalid. In this load-independent embodiment, the affected region includes the cell that has moved as well as the entire fan-out from that cell. The fan-out includes all logic cell ports that are fed directly or indirectly by any output of the moved cell. In this case, cell B6 has one output 2 that directly feeds two other cells. Specifically the output port 2 feeds input port 3 of cell B8 and input port 7 of cell B9. Hence, these input ports are marked invalid. The outputs of cells B8 and B9 (ports 4 and 8 respectively) also form part of the fan-out and hence are marked invalid. Moved cell B6 also indirectly feeds cells B11 and B12 (through the outputs of cells B8 and B9). Thus input ports 5 and 9 of cells B11 and B12 are marked invalid. Finally, the fanout ends at primary outputs 6 and 10 which are the output ports to cells B11 and B12. Thus, the collection of invalid ports 0–10 comprise the region affected by movement of cell B6 in this load-independent embodiment.

Movement of a cell from one logic element to another on a target hardware device will often change the load distribution among ports in a circuit. Considering the movement of cell B6 for example. Cells B4 and B5 feed cell B6. If cell B6 is moved with respect to either of these cells it affects the load felt by that cell. For example, if cell B6 is moved farther away from cell B4, the load driven by cell B4 likely increases (if movement of cell B6 is the only change). This load redistribution affects not only the timing of signals to port 0 on cell B6 (the port fed by cell B4), but also affects the timing at all other ports fed by cell B4 output. Thus, the timing the input of cell B10 might also have to be recalculated.

FIG. 5 shows a different affected region that may be delineated in a load-dependent embodiment. Here, the affected region is more expansive. It is defined by the fan-outs of the output ports that feed the input ports of the cell that has been modified (moved cell B6 in this example). In FIG. 5, the load-dependent affected region is defined by the output ports of cells B4 and B5 which together feed input ports 0 and 1 of cell B6. Because these output ports feed the moved cell, the load-dependent affected region includes at least the ports comprising the load-independent affected region. Typically it will include additional cells. In the example of FIG. 5, the affected region includes ports 0–10 which correspond to the entire affected region in FIG. 4. The load-dependent affected region also includes input 13 to cell B7 which is fed by the output of cell B5. As shown, the fan-out from the output of cell B5 includes ports 15 and 16 of cell B13 as well as ports 13 and 14 of cell B7. In addition, the fan-out from the output of cell B4 includes input port 11 and output port 12 of cell B10. Note that cell B10 has two input ports, but that only one of them has been marked as invalid. The other is not fed by the output port of cell B4, and so is not marked as invalid. Collectively invalid ports 0–16 comprise the region affected by the movement of cell B6 in the load-dependent embodiment.

Because the load-dependent affected region is larger than the load-independent affected region (and therefore requires more computational resources to calculate timing), it should be used only when relatively high precision and accuracy are possible and required. Otherwise the smaller load-independent region may be employed. Generally, the earlier stages of a large design effort provide relatively coarse designs that can not have their timings simulated with great accuracy. At such stage, the load-independent method often will be sufficient. At later stages when a large percentage of the design is fixed, and accurately measuring timing is critical, the load-dependent method will be preferred. Also, to the extent that the load is light in a given design under simulation (i.e., timing delay varies little with changes in load), the load-independent model may be suitable.

Obviously, it is impossible to precisely determine timing results until the line routes between various cells in the analysis are fixed. At early design phases, much or all of the placement and routing may be left unset. At later design phases, some or all of the placement and routing is set. To use the methods of this invention before the routing is set for the entire design, some assumptions and approximations must be put in place. Such approximations may be based upon models which predict delay or based upon statistical measures provided by experimental data. The nature of the approximation depends upon the level of detail of the design block. If it is a very high level design block such as a multiplier or other high level logic element, the approximate delay may simply represent a statistical average over dissimilar logic elements used in comparable designs. For example, an average delay may be specified for multipliers of a particular size and type implemented on a particular hardware layout. Multipliers of other sizes would have different approximate delay times.

Assuming that the design has been synthesized, the gate-level information is known. If the synthesized design has not yet been placed, certain parameters affect the approximate delay that may be used in a timing analysis of this invention. For example, the sizes of the fan-out and fan-in of a particular cell may determine the delay between it and the cell or cells that it feeds. Generally, if the cell has a large fan-out and/or fan-in, it will experience greater loading. It is also likely that it will be placed a relatively great distance away from at least one of the cells that it feeds. This can be understood by recognizing that it is unlikely that all the destinations of a cell having a large fan-out will be close to one another. Thus, it can be expected that at least one line from the cell under consideration will be relatively long. Also, if a cell has a large fanin, it is likely that it will be pulled toward one or more of its inputs. This may constrain it from being placed close to one or more of its outputs.

Other factors which effect the signal delay from a cell of a synthesized but unplaced design include the size of the cone of logic feeding it, the length of the logic path it is involved with (e.g., two cell path versus ten cell path), whether it is close to a critical path, and whether it is to be placed in a hierarchical design. Regarding this last factor, hierarchical designs typically include logic blocks of fixed numbers of cells which transmit signals among themselves very rapidly. Signals that must leave the logic block travel more slowly. Thus, if a cell has a relatively large fan-out, it can be expected that one or more output signals would likely travel outside of the local logic block. This results in a relatively greater delay. Considering a logic block having eight logic cells (logic elements), fan-outs of greater than eight require that at least one of the output signals travels outside of the local logic block. For smaller fan-outs, it is possible that all the output signals remain within the local logic block. Statistically, however, some signals will likely travel outside of the logic block. For example, it may be decided that if a cell has a fan-out of six, then there is a 75% chance that one of those signals will travel outside the local logic block. This statistical information can be used to predict the delay associated with an unplaced cell.

It should be understood that when using the approximate delays it may be appropriate to define a range of delays associated with a cell. Alternatively, the approximate delay may be a single value which is recognized to be of somewhat limited precision.

Possibly the first or second electronic design (as presented in FIGS. 3–5 for example) contains a combinational feedback loop provided from an output to an input of a particular cell. Such loops can greatly complicate the timing simulation. To simplify the system for analysis according to the methods of this invention, a preprocessing step may be performed to recast the design logic so that the feedback loop is removed ("pre-cut"), while retaining the identical functioning of the design. Such processes are well known to those skilled in the this technology area. This facilitates execution of certain specific techniques for timing simulation. Thus, such preprocessing should be performed after a cell is moved (step 17 of FIG. 1) but before determining the affected portion of the second electronic design.

In a conventional timing analysis, the time required for a signal to propagate through a circuit is determined by summing a number of internal propagation delays. Some are associated with the cells themselves. Others are associated with the lines connecting the cells. At each cell, there is a characteristic arrival time at which the signal arrives. By stepping through or summing the internal propagation delays, the overall timing of the circuit can be found. A linear time algorithm for computing the arrival time at each pin of a full circuit is described in R. B. Hitchcock, Sr., G. L. Smith, and D. D. Cheng, "Timing Analysis of Computer Hardware," IBM J. of Research and Development 26:1, pp. 100–105 (1982). That article is incorporated herein by reference for all purposes.

Figure 6:
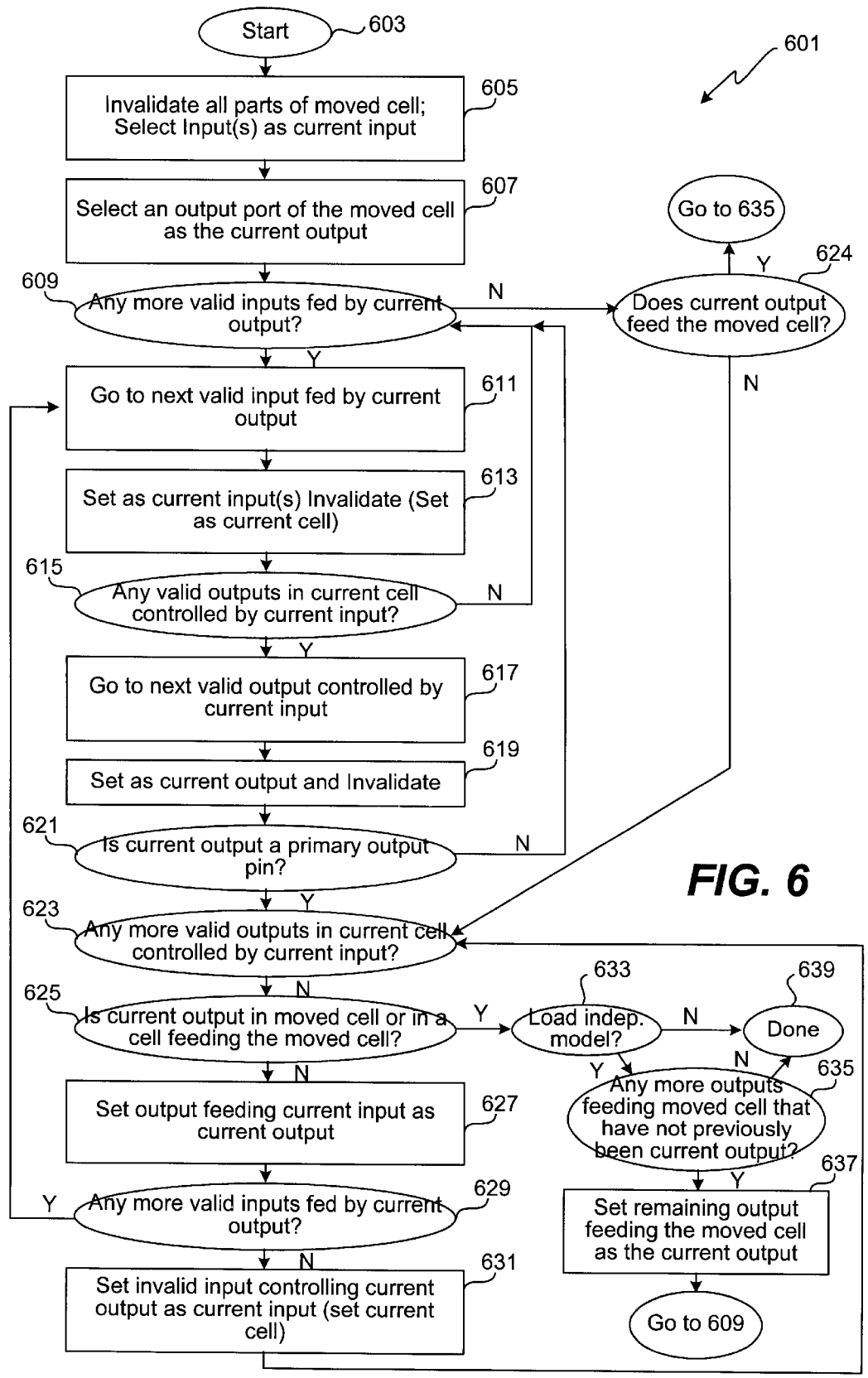
FIG. 6 is a flow chart depicting a method for delineating a collection of cells and ports which must have their timing recalculated during an incremental timing analysis.

FIG. 6 presents a flow chart depicting steps that may be employed to perform the recursions necessary to delineate an affected region as illustrated in FIGS. 4 and 5. The process of FIG. 6 corresponds to step 19 of FIG. 1. It should be understood that this is but one technique for delineating the boundaries of the affected region. Other processes (some employing different invalidation sequences) may be employed to the reach the same or similar results. In general, the process of FIG. 6 operates by invalidating all ports that form an output cone from the moved cell or from the outputs feeding the moved cell. This is accomplished by recursing from an initial node to a primary output pin and back again as many times as necessary to invalidate all ports that form part of the output cone. At the beginning of this process all ports (inputs and outputs) are deemed "valid." The recursion process encounters various nodes and marks them as "invalid" thereby adding them to the affected region.

Referring now to FIG. 6, a process 601 begins at 603 and in a step 605 invalidates all ports of the moved cell. At the same time, the system sets the inputs of the moved cells as "current inputs." The next steps involve tracing a path from the moved cell to a primary output pin (via looping, with each pass handling a single cell). At a step 607, the system selects an output of the moved cell as a "current output." Thereafter, the system determines, in decision step 609, whether there are any more valid input ports fed by the current output. Assuming that there is at least one valid input port fed by the current output (which will typically be the case immediately after an output from the moved cell is designated as the current output), the system chooses, at a step 611, one of the valid inputs fed by that current output. Then in a step 613, the system sets that input as the "current input and invalidates it." Also at that time, it sets the cell containing that input as the "current cell."

Next, at a decision step 615, the systems determines whether there are any valid outputs in the current cell that are controlled by the current input. If so, the system traverses to one of those valid outputs at a step 617. It then sets that output as the "current output" and invalidates it at a step 619.

Next, the system determines whether the current output is a primary output pin at a step 621. Assuming that the current output is not at a primary output pin, process control is directed back to decision step 609 where the system determines whether there are any more valid inputs fed by the current output. The process then continues as described above via steps 611, 613, etc. As can be seen, this process traces a path from the moved cell toward a primary output pin cell by cell, through the input and output ports.

There are three mechanisms for ending this march to the primary output pin. First, the system may find at step 609 that there are no more valid inputs fed by the current output. For example, all the inputs in the output cone may have been previously invalidated through another recursion path. When decision step 609 is answered in the negative, process controls directed to a decision step 623 (assuming that a decision step 624 is answered in the negative as it will be when the output cone of the moved cell is being delineated). At step 623, the system determines whether there are any additional valid outputs in the current cell that are controlled by the current input. If not, the system starts backtracking in hope of finding other valid input or output ports which form part of the output cone of the moved cell. The process for accomplishing this will be described in detail below. A second mechanism for stopping the traversal toward the primary output pin occurs when decision step 615 is answered in the negative. In other words, the system finds that there are no more valid outputs in the current cell that are controlled by the current input. At that point, process control reverts to decision step 609 where the system determines whether anymore valid inputs are fed by the current output. Assuming that the answer to this question is no, process control is directed to decision step 623 which is evaluated as described above. The final mechanism by which the march toward a primary output pin ends occurs when decision step 621 is answered in the affirmative. That is, the current output is found to be a primary output pin. At that point, process control is also directed to decision step 623.

If the system logic determines that decision step 623 is answered in the affirmative, then there are other valid outputs that are fed by the current input. When this is the case, process control is directed back to process step 617 where the system considers the next valid output controlled by the current input.

Assuming that decision step 623 is answered in the negative (i.e., there are no more valid outputs fed by the current input), the system determines whether the current output is in the moved cell or another cell which feeds the moved cell (see decision step 625). When the system traces back to this point, it may indicate that the recursion is nearing its conclusion. The mechanism for handling this will be described in more detail below. For now, assume that the current output is neither in the moved cell nor a cell feeding the moved cell (i.e., decision step 625 is answered in the negative). Then, the system sets the output that feeds the current input as the "current output" at a process step 627. This moves the frame of reference back from the current output to the input which feeds that output. Next, at a decision step 629, the system determines whether there are anymore valid inputs fed by the current output. Because the system moves the frame of reference back one cell, there may have been other valid inputs in the output cone which were not previously captured in the recursion. It is the purpose of step 629 to identify such remaining valid inputs. Assuming that the answer to step 629 is yes, process control is directed back to step 611 where the system considers the next valid input and thereafter invalidates it as described above. Assuming the opposite (i.e., that no more valid inputs are fed by the current output), the system must move the frame of reference back yet another notch. This is accomplished at a process step 631 where the system logic sets the invalid input port controlling the current output as the new "current input." It also sets the cell having the new current input to the new "current cell." From there, process control loops back to decision step 623 where the system again determines whether there any more valid outputs in the current cell that are controlled by the current input. This step is then handled as described above.

After tracing back through steps 623 through 631 a sufficient number of times (i.e., after all the ports in the output cone have been invalidated), decision step 625 will be answered in the affirmative. In other words, the current output resides in a cell that was moved or a cell feeding the moved cell. When this occurs, the system determines whether a load-dependent or a load-independent model applies. See step 633. If the system is using a load-independent model (as illustrated in FIG. 4), then the answer to this decision step is automatically no. When that is the case, the process is concluded at 639. However, if a load-dependent model is employed, the system decides at a decision step 635 whether there are any more outputs feeding the moved cell that have not previously been set as the "current output." Assuming that this is true, then the system sets a remaining output feeding the moved cell to be the current output. See step 637. From there, process control returns to decision step 609 where the recursion of another branch proceeds as described above. At some point during this recursion, process control will return to decision step 625 and it will be found that the current output is a cell feeding the moved cell. At this point, process control again goes to decision step 635 which determines whether there are any remaining outputs feeding the moved cell which have not before served as the current output. When this is the case, the process is concluded at 639 (for the load-dependent model).

Note that the above flow chart handles the load-independent model shown in FIGS. 4 as well as the load-dependent model shown in FIG. 5. In both cases, the recursion first carves out the output cone from the output of the moved cell. If the load-dependent model is used, then the frame of reference moves back to the one or more outputs which feed the moved cell via step 637. It is also necessary for the system to abort the process of recursing through a branch when the current output feeds the moved cell and there are no more valid inputs fed by that current output. This is capability is provided at decision step 624.

The process flow 601 will be described now with the examples presented in FIGS. 4 and 5. Focusing initially on FIG. 4, cell B6 is the moved cell. Step 605 of process 601 requires that all ports of cell B6 be invalidated. Thus, as shown in FIG. 4 input ports 0 and 1 and output port 2 are invalidated. Next, at step 607, output port 2 is selected as the current output. At steps 609, 611, and 613, input port 3 of cell B8 is selected, invalidated, and set as the current input. Cell B8 is also set as the current cell.

Next, at step 615, 617 and 619, output port 4 of cell B8 is selected, invalidated, and set as the current output. Because output 4 is not a primary output pin, decision step 621 is answered in the negative and process control returns to step 609.

The next pass through steps 609, 611, and 613 requires that input port 5 of cell B11 be selected, invalidated and set as the current input port. Steps 615, 617, and 619 then require selection and invalidation of output port 6 of cell B11. Because output port 6 is now the current output, decision step 621 is answered in the affirmative. In other words, the system determines that the current output is a primary output pin.

Next, the system determines whether there are any more valid outputs controlled by the current input (step 623). An evaluation of current input port 5 indicates that there are no other output ports controlled by it. Therefore, decision step 623 is answered in the negative and the system determines at step 625 whether the current output (port 6) is in the moved cell (cell B6). Because it is not, the system begins stepping back toward the moved cell in its recursion. Next, steps 627 and 620 move the current output back to output port 4 of cell B8 and determine whether there any remaining valid inputs fed by output port 4. As there are not, steps 631 and 623 move the current input back to input port 3 and determine whether there are any further output ports controlled by input port 3. As there are not, step 627 sets the current output back to output port 2 of moved cell B6.

Next, the system determines at step 629 whether there are any more valid inputs fed by the current output (output port 2). Examination shows that input port 7 of cell B9 is in fact a valid port that is fed by output port 2. Therefore, process control is directed to 611 where that step in conjunction with step 613 selects input port 7 (of cell B9), invalidates it, and sets it as the current input. Then, steps 617 and 619 invalidate output port 8. Because output port 8 is not a primary output pin, control loops back to step 609. Thereafter, steps 611, 613, 615, 617, and 619 invalidate input port 9 and output port 10 of cell B12.

Then the system determines at step 621 that output port 10 is a primary output pin and directs process control to decision step 623. Decision step 623 finds that there are no other output ports controlled by input port 9 (the current input) and directs process control to decision step 625 where it is found that the current output is not in the moved cell. Next, the current output is moved back, at step 627, to output port 8 of cell B9. Then the current input is moved back to input port 7 of cell B9 at step 631. After looping back through decision steps 623 and 625, the current output is set to output port 2 of moved cell B6. At this point, the system determines whether there are any more valid inputs fed by the current output at decision step 629. Because all input ports feeds by output port 2 have now been invalidated, decision step 629 must be answered in the negative. Thus, one of input ports 0 and 1 of moved cell B6 is set as the current input at step 631. Upon returning to decision step 625, the system finds that the current output is in the moved cell. Thus, process control is directed to step 633 where the system determines whether the load independent model is in effect. Assuming that it is (as in the example of FIG. 4), the process is completed at 639.

Assuming now that the load-dependent model as presented in FIG. 5 is applied. Applying process 601, the system will invalidate the same fan-out cone as was invalidated in FIG. 4. In other words, process 601 will initially invalidate ports 0–10 as described above.

However, when the system encounters decision step 623, it will determine that it is working with a load-dependent model. Therefore, process control is directed to decision step 635 where the system determines whether there are any more outputs feeding the moved cell. Because the outputs from cells B4 and B5 feed moved cell B6, they must be considered in this process. To handle this, the system sets the output of cell B4 as the current output at step 637 and then proceeds to step 609.

One pass through the loop controlled at step 609 invalidates input port 11 and output port 12 of cell B10. Thereafter, one pass through the trace-back loop controlled at decision step 623 sets cell B4 as the current cell. At the next opportunity the system determines, at step 625, that the current output is in a cell that feeds the move to cell. This sends the process back through steps 633, 635, and 637. The result is that the output port of cell B5 is set as the current output.

After process control is sent back to decision step 609, two passes through the forward recursion loop invalidates input port 13 and output port 14 of cell B7 and input port 15 and output port 16 of cell B13. Then, two loops through the backward recursion loop set cell B5 as the current cell. This directs process control back through steps 633 and 635. This time, when step 635 is reached, it is found that there are no remaining outputs feeding the moved cell that have not previously served as the current output. Thus, the process is completed at 639 with the entire load-dependent affected region being invalidated.

Note that step 21 of FIG. 1 requires performing the timing analysis on the invalidated region. This step can be performed by any conventional technique. In one embodiment, the technique employed is outlined in the Hitchcock, Sr., et al. article mentioned above. At each node having multiple inputs or paths to an output, there may be multiple timing values at the output. Generally, the latest of these timing values will be selected going forward to downstream nodes in the timing analysis.

4. Computer System Embodiments

Embodiments of the present invention as described above employ various operations involving data stored in computer systems. Useful machines for performing the operations of this invention include general purpose digital computers or other data processing devices. Such apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 7:
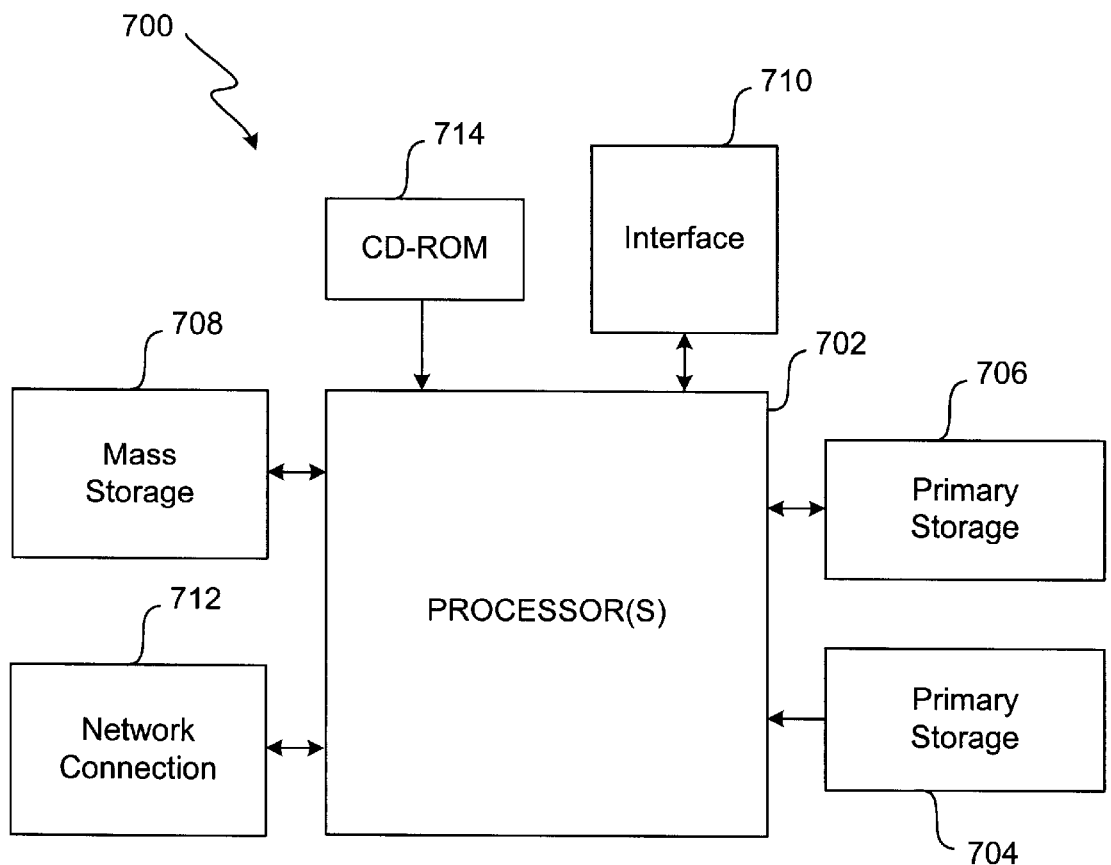
FIG. 7 is a block diagram of a typical computer system suitable for implementing an embodiment of the present invention.

FIG. 7 illustrates a typical computer system in accordance with an embodiment of the present invention. The computer system 700 includes any number of processors 702 (also referred to as central processing units, or CPUs) that are coupled to storage devices including primary storage 706 (typically a random access memory, or RAM), primary storage 704 (typically a read only memory, or ROM). As is well known in the art, primary storage 704 acts to transfer data and instructions uni-directionally to the CPU and primary storage 706 is used typically to transfer data and instructions in a bi-directional manner. Both of these primary storage devices may include any suitable of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than primary storage. It will be appreciated that the information retained within the mass storage device 708, may, in appropriate cases, be incorporated in standard fashion as part of primary storage 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. The above-described devices and materials will be familiar to those of skill in the computer hardware and software arts.

Figure 8:
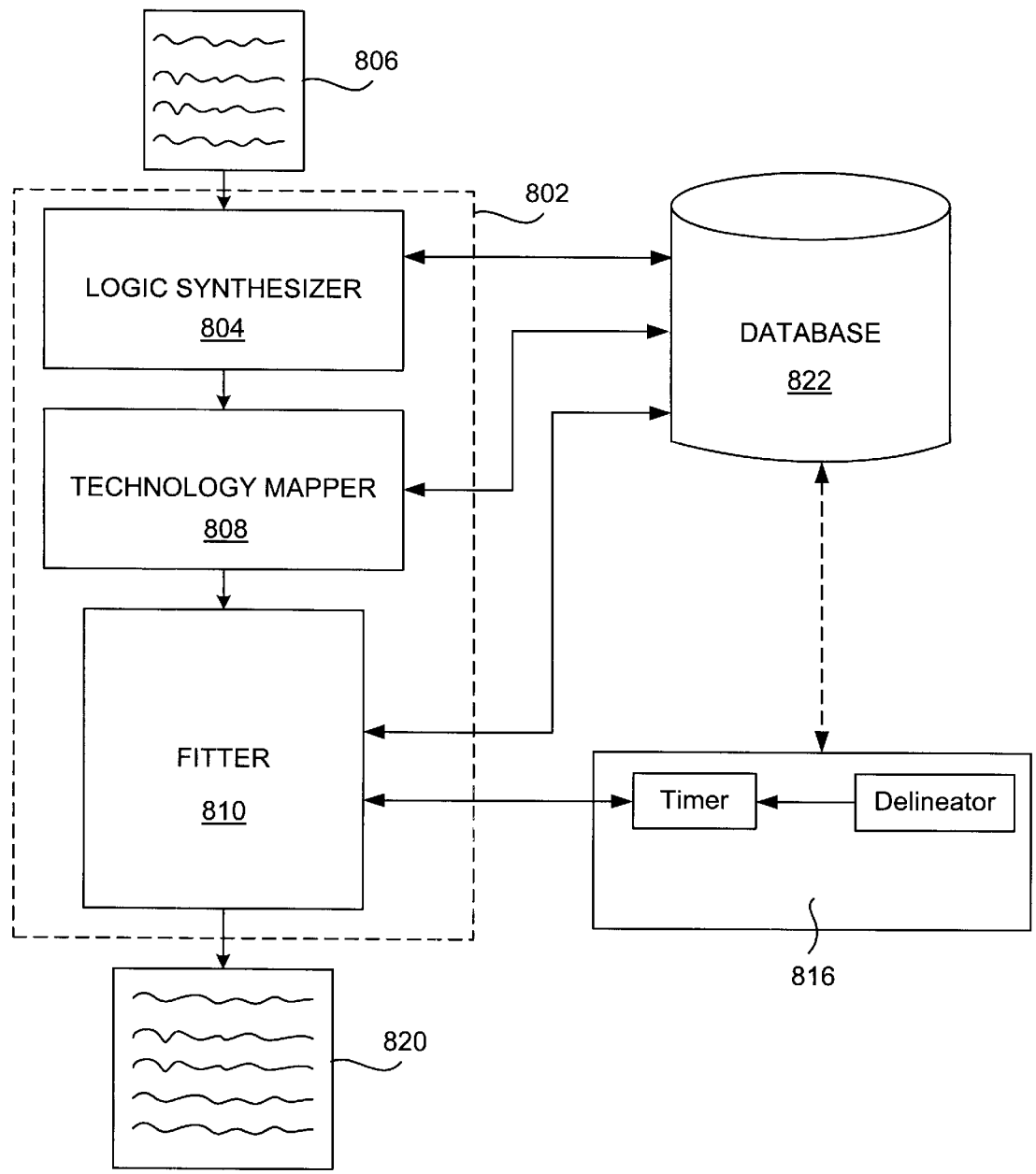
FIG. 8 is a block diagram showing modules that may be employed in a PLD design compiler and timing analyzer of this invention.

The hardware elements described above may implement the instructions of multiple software modules for performing the operations of this invention. For example, instructions for running a compiler or timing analyzer may be stored on mass storage device 708 or 714 and executed on CPU 708 in conjunction with primary memory 706. In a preferred embodiment, the relevant compiler/timing analyzer is divided into software submodules. Referring to FIG. 8, a compiler 802 includes a logic synthesizer 804 which creates a synthesized netlist from a user's high level electronic design 806. Compiler 802 also includes a technology mapper 808 which maps gates from the synthesized netlist into logic cells. Compiler 802 includes a fitter module 810 which partitions and places logic cells onto specific logic elements of a target hardware device. It also connects wires between the inputs and outputs of the various logic elements in accordance with the logic required to implement the electronic design. Compiler 802 outputs a compiled design 820. It should be understood that other compiler designs may be employed with this invention. In addition, the compiler may be adapted to handle hierarchical designs, whereby synthesis, mapping, etc. are performed recursively as the compiler moves down branches of a hierarchy tree. Additional details of compiler software for PLDs may be found in U.S. patent application Ser. No. 08/958,670, naming D. Mendel as inventor, and entitled "PARALLEL PROCESSING FOR COMPUTER ASSISTED DESIGN OF ELECTRONIC DEVICES" (previously incorporated by reference).

As shown in FIG. 8, the system also includes a timing analyzer module 816 which may form part of compiler 802 or may exist as a separate module (as shown). Generally, the timing analyzer, compiler, and associated modules will form part of an electronic design automation (EDA) system. Note that all components of compiler 802 (and timing analyzer 816) make use of a compiler database 822 which stores the data describing the design in its compiled or partially compiled state. Thus database 822 stores the information pertaining to the layout and timing of both the first and second electronic designs used in the methods of this invention.

Preferably, the timing analyzer includes separate modules for (i) delineating an affected region of a modified (second) electronic design and (ii) performing a local timing analysis on the delineated affected region. The modules may take the form of blocks of computer code executing on a processor, for example. The module for delineating the affected region may be referred to as a "delineator" and the module for calculating local timing results in the affected region may be referred to as a "timer."

The timing analyzer may interact with the compiler components in various ways. For example, it may receive control instructions and data from fitter 810. In such cases, it need not interact with database 822. Alternatively, it may receive only control instructions from fitter 810. In such cases, analyzer 816 would have to communicate directly with database 822 in order to obtain timing information from the unaffected region of the first electronic design, as well as details of the affected region, including the moved cell and its new location.

Figure 9:
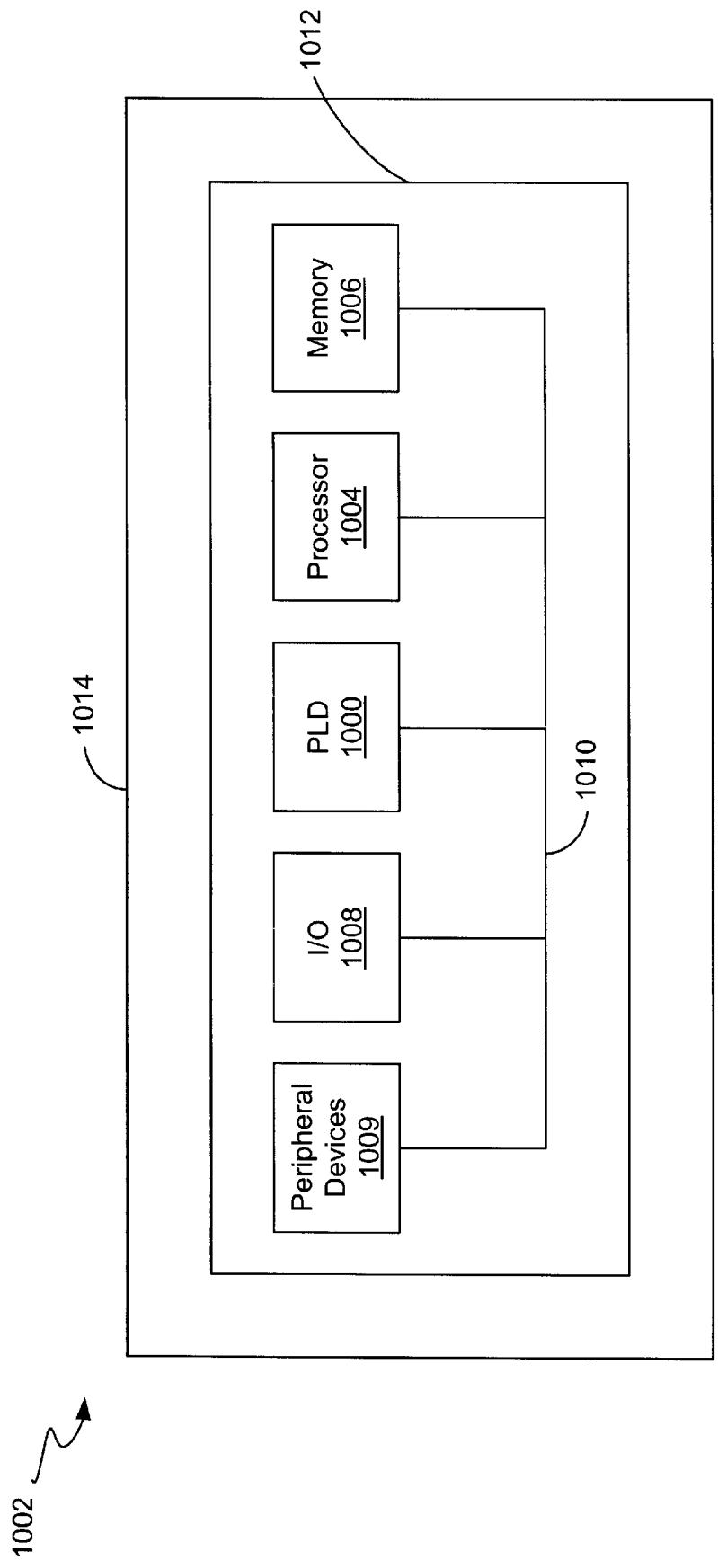
FIG. 9 illustrates a data processing system containing a PLD produced in accordance with this present invention.

This invention also relates to programmable logic devices programmed with a design prepared in accordance with the above described methods. The invention further relates to systems employing such programmable logic devices. FIG. 9 illustrates a PLD 1000 of the present invention in a data processing system 1002. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital signal processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

The foregoing describes the instant invention and its presently preferred embodiments. Numerous modifications and variations in the practice of this invention are expected to occur to those skilled in the art. Therefore, the described embodiments should be taken as illustrative and not restrictive, and the invention should not be limited to the details given herein but should be defined by the following claims and their full scope of equivalents.

What is claimed is:

1. A method for performing a timing analysis on an electronic design, the method comprising:
   (a) storing timing results of a first timing analysis performed on a first electronic design;
   (b) modifying a portion of the first electronic design to form a second electronic design containing a modified portion and an unmodified portion;
   (c) identifying an affected portion of the second electronic design where the timing results may have been locally changed as a result of the modification; and
   (d) performing a second timing analysis comprising:
      (i) calculating a local timing result for the affected portion of the second electronic design; and
      (ii) calculating an overall timing result of the second electronic design by using the local timing result together with an unmodified timing result of the first electronic design for that portion of the first electronic design outside of the affected portion of the second electronic design.

2. The method of claim 1, wherein the first electronic design is an ASIC design.

3. The method of claim 1, wherein the first electronic design is a PLD design.

4. The method of claim 1, wherein the affected portion of the second electronic design subsumes the modified portion of the second electronic design.

5. The method of claim 1, wherein the first timing analysis is performed on a compiled PLD design.

6. The method of claim 1, wherein the first and second electronic designs on which the first and second timing analyses are performed are compiled designs.

7. The method of claim 1, wherein modifying a portion of the first electronic design involves refitting that portion of the first electronic design.

8. The method of claim 7, wherein the refitting involves repartitioning the portion of the first electronic design.

9. The EDA system of claim 8, wherein the fitter moves one or more logic cells to create the modified design.

10. The method of claim 1, wherein the modifying a portion of the first electronic design involves moving a cell in first electronic design.

11. The method of claim 10, wherein the affected portion of the second electronic design includes the fan-out from the output nodes of any cells that feed the cell that has been moved.

12. The method of claim 10, wherein the affected portion of the second electronic design includes the fan-out from the output nodes of a cell that has been moved, together with the cell that has been moved.

13. The method of claim 1, further comprising comparing the overall timing result to a timing constraint.

14. The method of claim 1, further comprising converting the timing constraint from one type to a second type.

15. The method of claim 1, wherein the overall timing results are provided in the form of Tpd.

16. A programmable logic device designed using the timing analysis of claim 1.

17. An electronic design automation system comprising:
a fitter which fits logic onto a target hardware device; and
a timing analyzer including:
(i) a delineator which identifies an affected region of a modified design where timing may have been locally changed as a result of a modification from a previous design, and
(ii) a timer which calculates the timing at nodes within the affected region.

18. The EDA system of claim 17 further comprising a database communicating with said fitter and storing design data for the modified design.

19. The EDA system of claim 18, wherein the timing analyzer obtains design data from the database, without having the design data past through the fitter.

20. The EDA system of claim 18, wherein the timing analyzer obtains the design data from the database via the fitter.

21. The EDA system of claim 18, wherein the database also stores design data associated with the previous design.

22. The EDA system of claim 17, wherein the target hardware device is a programmable logic device.

23. The EDA system of claim 17, wherein the logic fit onto the target hardware device comprises logic cells.

24. The EDA system of claim 17, wherein the fitter is provided as part of an electronic design compiler.

25. The EDA system of claim 24, wherein the compiler further includes a logic synthesizer.

26. A machine readable medium comprising instructions for performing a timing analysis on an electronic design, the instructions comprising:

(a) storing timing results of a first timing analysis performed on a first electronic design;
(b) modifying a portion of the first electronic design to form a second electronic design containing a modified portion and an unmodified portion;
(c) identifying an affected portion of the second electronic design where the timing results may have been locally changed as a result of the modification; and
(d) performing a second timing analysis comprising:
(i) calculating a local timing result for the affected portion of the second electronic design; and
(ii) calculating an overall timing result of the second electronic design by using the local timing result together with an unmodified timing result of the first electronic design for that portion of the first electronic design outside of the affected portion of the second electronic design.

27. The machine readable medium of claim 26, wherein the affected portion of the second electronic design subsumes the modified portion of the second electronic design.

28. The machine readable medium of claim 26, wherein the first timing analysis was performed on a compiled PLD design.

29. The machine readable medium of claim 26, wherein the first and second electronic designs on which the first and second timing analyses were performed are compiled designs.

30. The machine readable medium of claim 26, wherein modifying a portion of the first electronic design involves refitting that portion of the first electronic design.

31. The machine readable medium of claim 30, wherein the refitting involves repartitioning the portion of the first electronic design.

32. The machine readable medium of claim 26, wherein modifying a portion of the first electronic design involves moving a cell in first electronic design.

33. The machine readable medium of claim 32, wherein the affected portion of the second electronic design includes the fan-out from the output nodes of a cell that has been moved, together with the cell that has been moved.

34. The machine readable medium of claim 32, wherein the affected portion of the second electronic design includes the fan-out from the output nodes of any cells that feed the cell that has been moved.

35. The machine readable medium of claim 26, wherein the overall timing results are provided in the form of Tpd.

36. The machine readable medium of claim 26, wherein the instructions further specify comparing the overall timing result to a timing constraint.

37. The machine readable medium of claim 26, wherein the instructions further specify converting the timing constraint from one type to a second type.

* * * * *